US012685060B2

(12) United States Patent
Wyant

(10) Patent No.: US 12,685,060 B2
(45) Date of Patent: Jul. 14, 2026

(54) METHODS OF SEPARATING SEMICONDUCTOR DIES

(71) Applicant: Texas Instruments Incorporated, Dallas, TX (US)

(72) Inventor: Michael Todd Wyant, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 728 days.

(21) Appl. No.: 17/823,797

(22) Filed: Aug. 31, 2022

(65) Prior Publication Data

US 2024/0071828 A1     Feb. 29, 2024

(51) Int. Cl.
*H10P 58/00*        (2026.01)
*H10P 50/24*        (2026.01)
*H10P 70/00*        (2026.01)
*H10W 72/00*        (2026.01)

(52) U.S. Cl.
CPC ............ *H10P 58/00* (2026.01); *H10P 50/242* (2026.01); *H10P 70/23* (2026.01); *H10P 70/60* (2026.01); *H10W 72/00* (2026.01)

(58) Field of Classification Search
CPC .......... H01L 21/0206; H01L 21/02096; H01L 21/3065; H01L 23/50; H01L 21/6836; H01L 21/0272; H01L 21/30655; H01L 2221/68327; H01L 21/78; H10D 89/013; H10P 54/00; H10P 72/7402
See application file for complete search history.

(56) References Cited

U.S. PATENT DOCUMENTS

| | | | |
|---|---|---|---|
| 2007/0275541 A1 | 11/2007 | Harris | |
| 2010/0120230 A1* | 5/2010 | Grivna | H01L 21/78 |
| | | | 438/464 |
| 2018/0350615 A1* | 12/2018 | Ansell | H01L 21/78 |
| 2020/0321250 A1* | 10/2020 | Seddon | H01L 21/30604 |
| 2021/0217664 A1* | 7/2021 | Seddon | H01L 21/268 |

FOREIGN PATENT DOCUMENTS

KR        20100131159 A     12/2010

OTHER PUBLICATIONS

International Search Report dated Dec. 18, 2023.

* cited by examiner

*Primary Examiner* — Christine S. Kim
*Assistant Examiner* — Andrew Victor Prostor
(74) *Attorney, Agent, or Firm* — Yudong Kim; Frank D. Cimino

(57)        ABSTRACT

Methods of separating semiconductor dies are described. The method can separate individual semiconductor dies from a semiconductor wafer without using a blade. The methods include a plasma etch process utilizing metal structures formed on a back side of the wafer as masks to remove a portion of the semiconductor wafer from the back side. The portion removed by the plasma etch process corresponds to the scribe lines between the semiconductor dies. The plasma etch process terminates at a dielectric layer formed on a front side of the wafer. The dielectric layer may be severed to complete the separation process. Moreover, an ultrasonic water jet process may be utilized to remove burrs of the dielectric layer that has been severed.

24 Claims, 14 Drawing Sheets

600

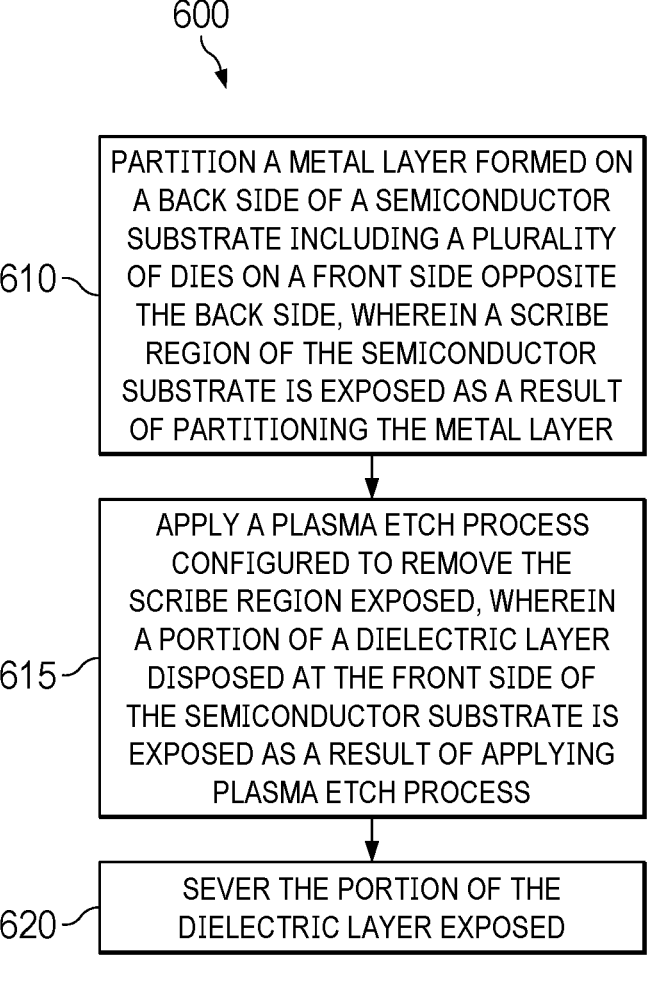

610 — PARTITION A METAL LAYER FORMED ON A BACK SIDE OF A SEMICONDUCTOR SUBSTRATE INCLUDING A PLURALITY OF DIES ON A FRONT SIDE OPPOSITE THE BACK SIDE, WHEREIN A SCRIBE REGION OF THE SEMICONDUCTOR SUBSTRATE IS EXPOSED AS A RESULT OF PARTITIONING THE METAL LAYER

615 — APPLY A PLASMA ETCH PROCESS CONFIGURED TO REMOVE THE SCRIBE REGION EXPOSED, WHEREIN A PORTION OF A DIELECTRIC LAYER DISPOSED AT THE FRONT SIDE OF THE SEMICONDUCTOR SUBSTRATE IS EXPOSED AS A RESULT OF APPLYING PLASMA ETCH PROCESS

620 — SEVER THE PORTION OF THE DIELECTRIC LAYER EXPOSED

FIG. 6

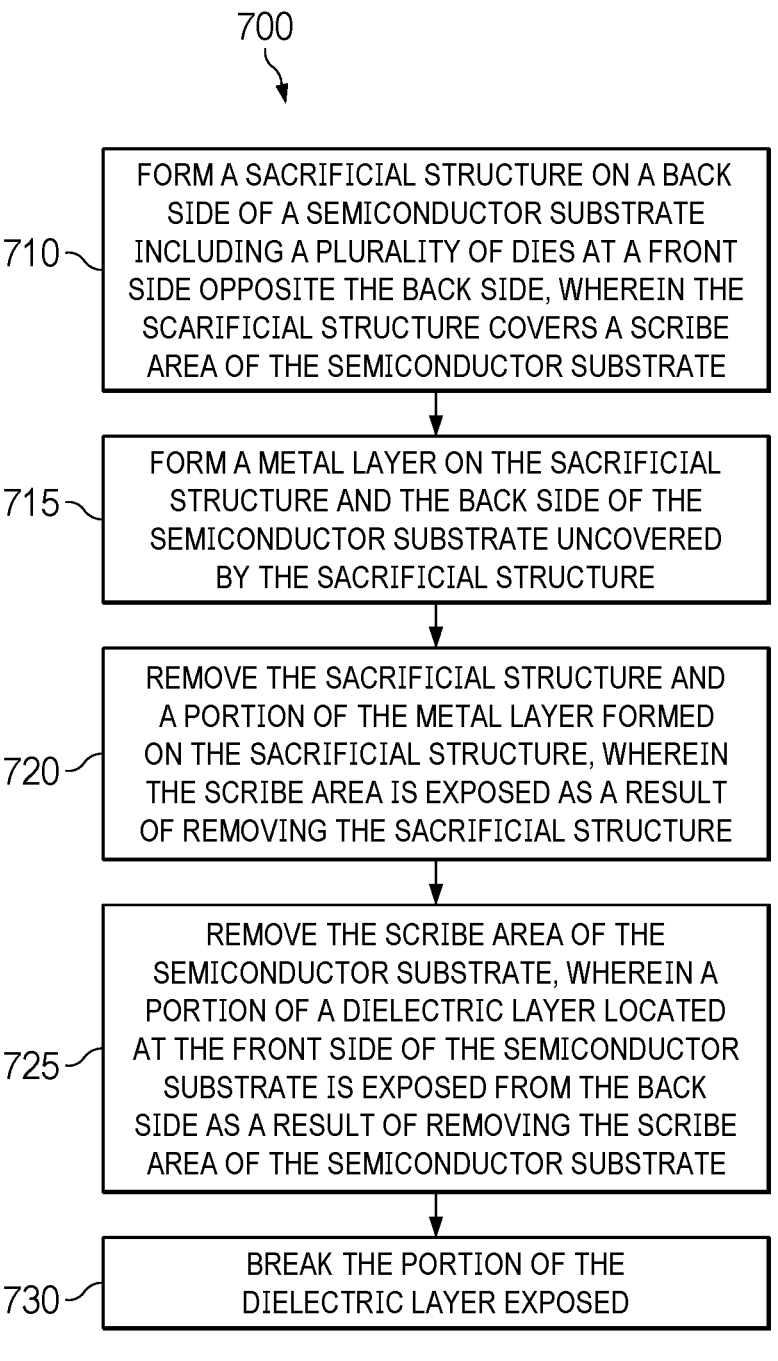

700

710 —| FORM A SACRIFICIAL STRUCTURE ON A BACK SIDE OF A SEMICONDUCTOR SUBSTRATE INCLUDING A PLURALITY OF DIES AT A FRONT SIDE OPPOSITE THE BACK SIDE, WHEREIN THE SCARIFICIAL STRUCTURE COVERS A SCRIBE AREA OF THE SEMICONDUCTOR SUBSTRATE

715 —| FORM A METAL LAYER ON THE SACRIFICIAL STRUCTURE AND THE BACK SIDE OF THE SEMICONDUCTOR SUBSTRATE UNCOVERED BY THE SACRIFICIAL STRUCTURE

720 —| REMOVE THE SACRIFICIAL STRUCTURE AND A PORTION OF THE METAL LAYER FORMED ON THE SACRIFICIAL STRUCTURE, WHEREIN THE SCRIBE AREA IS EXPOSED AS A RESULT OF REMOVING THE SACRIFICIAL STRUCTURE

725 —| REMOVE THE SCRIBE AREA OF THE SEMICONDUCTOR SUBSTRATE, WHEREIN A PORTION OF A DIELECTRIC LAYER LOCATED AT THE FRONT SIDE OF THE SEMICONDUCTOR SUBSTRATE IS EXPOSED FROM THE BACK SIDE AS A RESULT OF REMOVING THE SCRIBE AREA OF THE SEMICONDUCTOR SUBSTRATE

730 —| BREAK THE PORTION OF THE DIELECTRIC LAYER EXPOSED

FIG. 7

METHODS OF SEPARATING SEMICONDUCTOR DIES

TECHNICAL FIELD

The present disclosure generally relates to the field of semiconductor packages, and more particularly to methods of separating semiconductor dies.

BACKGROUND

A semiconductor package is a metal, plastic, glass, or ceramic casing containing one or more semiconductor dies. The package provides conductive members (e.g., leads) connecting the semiconductor dies to an external environment, such as a printed circuit board (PCB). Moreover, the package protects the semiconductor dies against hazards such as mechanical impact or chemical contamination. Semiconductor dies are fabricated on semiconductor wafers before being diced into individual dies and packaged. The dicing process requires certain areas set aside between the semiconductor dies, which may be referred to as scribe lines. The scribe lines should be configured to accommodate various outcomes associated with the nature of techniques used for dicing. Mechanical dicing techniques typically utilize a blade and face a variety of challenges in reducing the area of a semiconductor wafer occupied by the scribe lines.

SUMMARY

The present disclosure describes methods for separating semiconductor dies. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In some embodiments, a method comprises partitioning a metal layer formed on a back side of a semiconductor substrate including a plurality of dies on a front side opposite the back side, where a scribe region of the semiconductor substrate is exposed as a result of partitioning the metal layer; applying a plasma etch process configured to remove the scribe region exposed, where a portion of a dielectric layer disposed at the front side of the semiconductor substrate is exposed as a result of applying the plasma etch process; and severing the portion of the dielectric layer exposed.

In some embodiments, a method comprises forming a sacrificial structure on a back side of a semiconductor substrate including a plurality of dies at a front side opposite the back side, where the sacrificial structure covers a scribe area of the semiconductor substrate; forming a metal layer on the sacrificial structure and the back side of the semiconductor substrate uncovered by the sacrificial structure; removing the sacrificial structure and a portion of the metal layer formed on the sacrificial structure, where the scribe area is exposed as a result of removing the sacrificial structure; removing the scribe area of the semiconductor substrate, where a portion of a dielectric layer located at the front side of the semiconductor substrate is exposed from the back side as a result of removing the scribe area of the semiconductor substrate; and breaking the portion of the dielectric layer exposed.

In some embodiments, a semiconductor die comprises a semiconductor substrate including integrated circuitry at a front side of the semiconductor substrate; and a metal structure formed on a back side of the semiconductor substrate opposite the front side, where a sidewall profile of the semiconductor substrate includes a plurality of ridges.

BRIEF DESCRIPTION OF THE DRAWINGS

FIGS. 6 and 7 are flowcharts illustrating methods of separating semiconductor dies in accordance with aspects of the present disclosure.

DETAILED DESCRIPTION

Figure 1A:
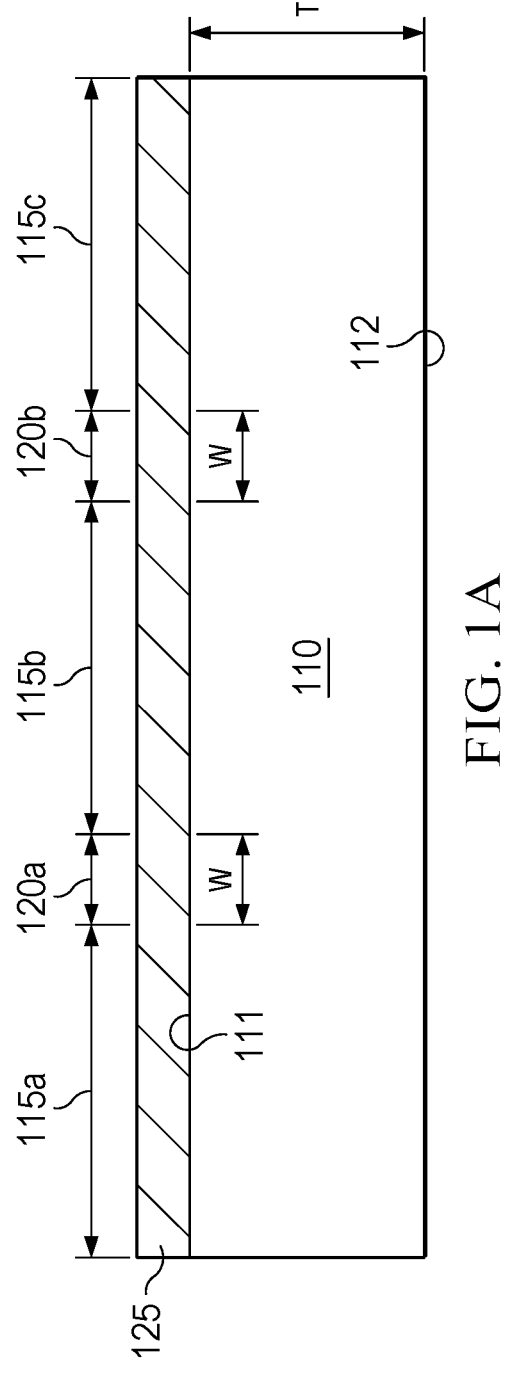
FIGS. 1A through 1L illustrate steps of separating semiconductor dies in accordance with embodiments of the present disclosure.

The present disclosure is described with reference to the attached figures. The components in the figures are not drawn to scale. Instead, emphasis is placed on clearly illustrating overall features and the principles of the present disclosure. Numerous specific details and relationships are set forth with reference to example embodiments of the figures to provide an understanding of the disclosure. It is to be understood that the figures and examples are not meant to limit the scope of the present disclosure to such example embodiments, and other embodiments are possible by way of interchanging or modifying at least some of the described or illustrated elements or process steps. Moreover, where elements of the present disclosure can be partially or fully implemented using known components or process steps, those portions of such components or process steps that facilitate an understanding of the present disclosure are described, and detailed descriptions of other portions of such components or process steps are omitted so as not to obscure the disclosure.

As used herein, terms such as "first" and "second" are used to arbitrarily distinguish between the elements such terms describe. Thus, these terms in the description and in the claims are not intended to indicate temporal or other prioritization of such elements. Moreover, terms such as "front," "back," "top," "bottom," "over," "under," "vertical," "horizontal," "lateral," "down," "up," "upper," "lower," or the like, are used to refer to relative directions or positions of features in the semiconductor devices in view of the orientation shown in the figures. For example, "upper" or "uppermost" can refer to a feature positioned closer to the top of a page than other features. It is to be understood that the terms so used are interchangeable under appropriate circumstances such that the embodiments of the technology described herein are, for example, capable of operation in other orientations than those illustrated or otherwise described herein.

Semiconductor dies or devices, integrated circuitry, or integrated circuit (IC) components described herein may be formed on a semiconductor substrate (or die) including various semiconductor materials, such as silicon, germanium, silicon-germanium alloy, gallium arsenide, gallium nitride, silicon carbide, or the like. In some cases, the substrate refers to a semiconductor wafer. Various structures disclosed herein can be formed using semiconductor process techniques. Layers including various materials can be formed over a semiconductor substrate, for example, using deposition techniques (e.g., chemical vapor deposition, physical vapor deposition, atomic layer deposition, spin coating, plating), thermal process techniques (e.g., oxidation, nitridation, epitaxy), and/or other suitable techniques. Similarly, some portions of the layers can be selectively removed, for example, using etching techniques (e.g., plasma (or dry) etching, wet etching), chemical mechanical planarization, and/or other suitable techniques, some of which may be combined with photolithography steps.

The present disclosure describes methods of separating semiconductor dies. The methods can separate (dice or singulate) individual semiconductor dies from a semiconductor wafer without using a blade (or a saw) or using a laser. Moreover, the methods facilitate forming a metal layer on a back side of a semiconductor die (which may be referred to as back side metal (BSM)), which may be beneficial for certain semiconductor devices or applications—e.g., power field effect transistor (FET) devices or applications. The methods do not require modifications to various structures present in the scribe lines, which may be referred to as scribe line structures. Also, the methods can reduce widths of the scribe lines to be less than what typical mechanical dicing processes require. The methods may facilitate reducing the final substrate thickness to be less than what typical mechanical dicing processes require to maintain structural integrity of the semiconductor dies. Reducing the substrate thickness may be beneficial for certain semiconductor devices—e.g., reducing electrical resistance between source and drain (Rds) of a power FET.

FIGS. 1A through 1L illustrate various steps of separating semiconductor dies in accordance with embodiments of the present disclosure. FIG. 1A shows a semiconductor substrate 110 having a first surface 111 (top surface, front surface, top side, front side) and a second surface 112 (bottom surface, back surface, bottom side, back side) opposite the first surface 111. The semiconductor substrate 110 may be a semiconductor wafer with a thickness (denoted as T1) ranging from about 600 to about 800 microns. The semiconductor substrate 110 may include multitudes of semiconductor dies 115 (also identified individually as semiconductor dies 115a-c). Although the semiconductor substrate 110 is shown to have three semiconductor dies 115 for illustration purposes only, the semiconductor substrate 110 may include many more semiconductor dies 115, for example, several hundreds of semiconductor dies 115 or even more. The semiconductor substrate 110 (or individual semiconductor dies 115) include integrated circuitry (not shown) at the first surface 111. In some embodiments, the integrated circuitry includes a power FET or a circuit having one or more power FETs.

The semiconductor substrate 110 includes scribe lines 120 (also identified individually as scribe lines 120a/b) between the semiconductor dies 115. The scribe lines (which may also be referred to as streets, dicing lanes, or the like) may have a width "W" as denoted in FIG. 1A. The scribe line width may be configured to accommodate various aspects of wafer dicing techniques. For example, mechanical dicing techniques using a blade typically require the scribe line width to be at least about 80 microns or greater so as to accommodate a width of the kerf generated by the blade, as well as to avoid undesirable mechanical effects to the semiconductor dies 115—e.g., cracks propagating towards integrated circuitry or chipping at the edges of semiconductor dies. Chipping during the mechanical dicing process may reach about 30 microns or greater in size. As described in more detail herein, the present disclosure can separate the semiconductor dies 115 from the semiconductor substrate 110 with scribe line widths of approximately 50 microns, 30 microns, 20 microns, or even less (e.g., 10 microns or less).

FIG. 1A also shows a dielectric layer 125 formed on the first surface 111 of the semiconductor substrate 110. The dielectric layer 125 may include one or more inter-level metallization or multi-level metallization (MLM) layers. For example, the dielectric layer 125 includes one or more conductive layers (e.g., 4 or 5 layers of metallization) including aluminum or copper, as well as via structures (e.g., tungsten vias, copper vias) connecting the one or more conductive layers. The dielectric layer 125 also includes various dielectric layers providing electrical isolation between the conductive layers, such as silicon oxides (e.g., $SiO_2$), tetraethoxysilane (TEOS), silicon nitrides (e.g., $Si_3N_4$), silicon oxynitrides (e.g., $SiO_xN_y$), or the like. The MLM layers of the dielectric layer 125 are connected to the integrated circuitry of corresponding dies 115.

The dielectric layer 125 corresponding to the scribe lines 120 may include various structures (which may also be referred to as scribe line structures) built with the MLM layers. For example, the scribe line structures may include in-line electrical test structures, process monitor structures (e.g., measuring critical dimensions or overlays between the layers, measuring thicknesses of various layers), dummy fill features for process uniformity (e.g., during dry etch process steps, during chemical-mechanical polishing process steps). Accordingly, the scribe line structures may include various metal layers or structures.

The metal layers or structures present in the dielectric layer 125 can pose challenges for utilizing a laser or a plasma process (e.g., laser dicing techniques, plasma dicing techniques) because the metal layers (or metal structures) can significantly hinder the laser or plasma dicing process. The laser or plasma dicing techniques may be considered advantageous over the mechanical dicing techniques (e.g., in reducing the scribe line widths), but may require process changes to remove the metal layers in the scribe line structures. As described in more detail herein, the present disclosure can provide for separating the semiconductor dies 115 despite the scribe line structures (with or without metal layers).

Figure 1B:
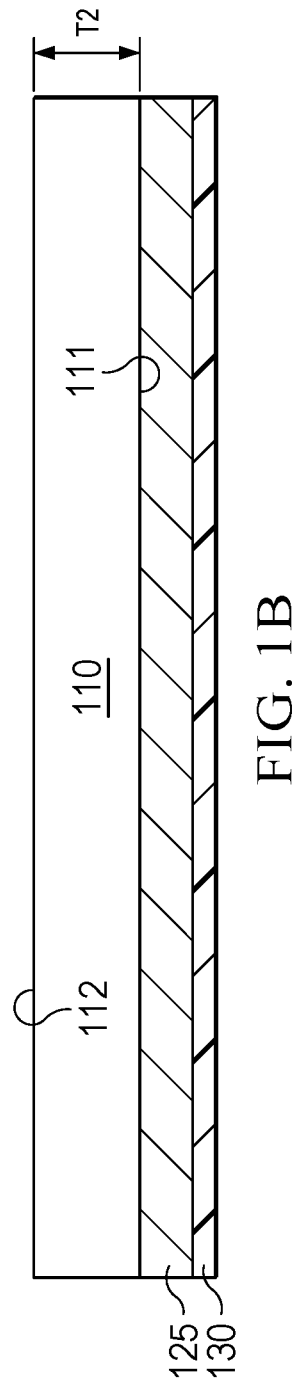

FIG. 1B shows the semiconductor substrate 110 that has been thinned from the back side 112 to a final thickness (denoted as T2). In some embodiments, a first adhesive tape 130 (attached to a frame ring, which is not shown) can be attached to the dielectric layer 125. Subsequently, the semiconductor substrate 110 can be thinned (e.g., grind down) from the back side 112. The first adhesive tape 130 may be referred to as a back-grind tape (a BG tape). The final thickness of the semiconductor substrate 110 may be determined based on dicing techniques to be used for separating individual semiconductor dies 115 from the semiconductor substrate 110.

As for mechanical dicing techniques using a blade, the final thickness may be about 4 mils (i.e., about 100 microns) or greater to sustain various mechanical force exerted upon the semiconductor substrate 110 during the mechanical dicing process. As described in more detail herein, the present disclosure can provide for reducing the final thickness of the semiconductor substrate 110 (e.g., less than 4 mils), at least partially due to lack of the blade used to separate the semiconductor dies 115. For example, the final thickness (T2) of the semiconductor substrate 110 may be 3 mils, 2 mils, 1 mil, or even less. The reduced final thickness of the semiconductor substrate 110 (e.g., when compared to the final thickness for the mechanical dicing) may be advantageous for certain semiconductor devices or operations— e.g., a power FET device or a circuit including one or more power FETs.

Figure 1C:
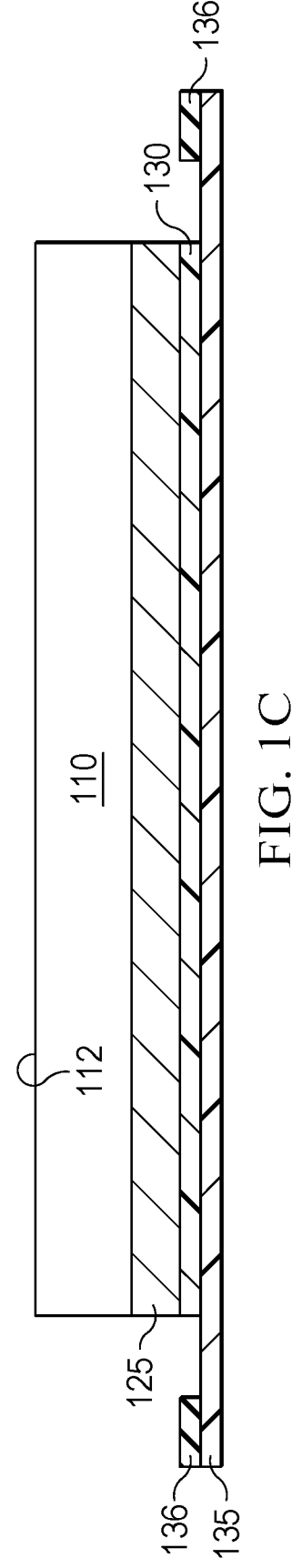
Figure 1D:
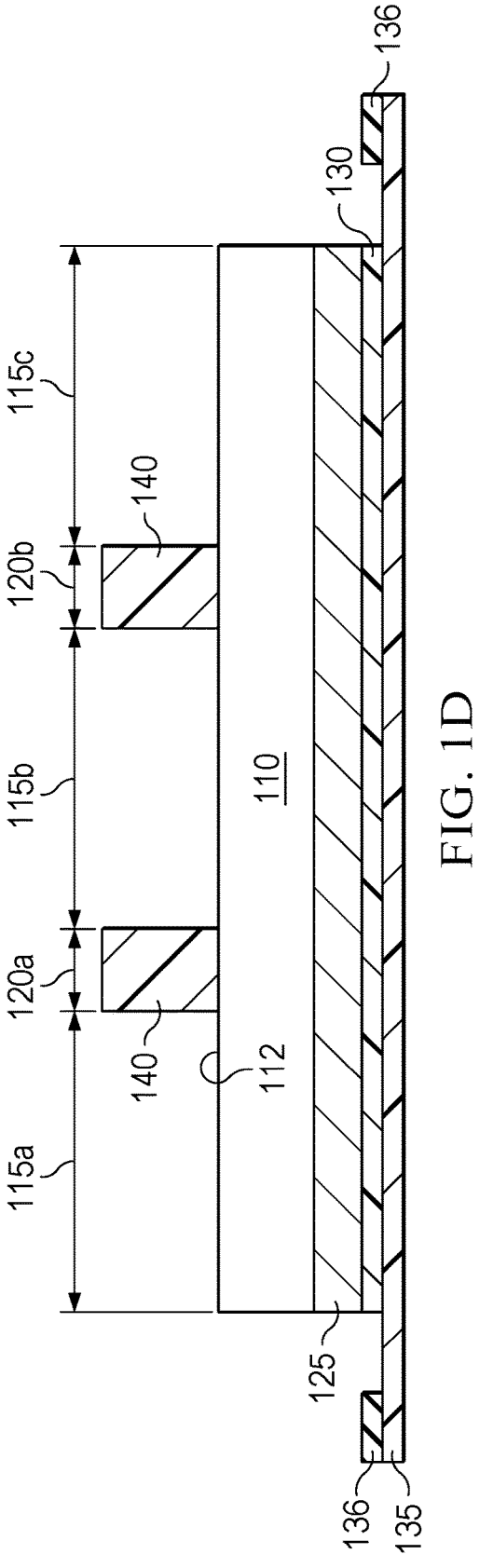
Figure 1E:
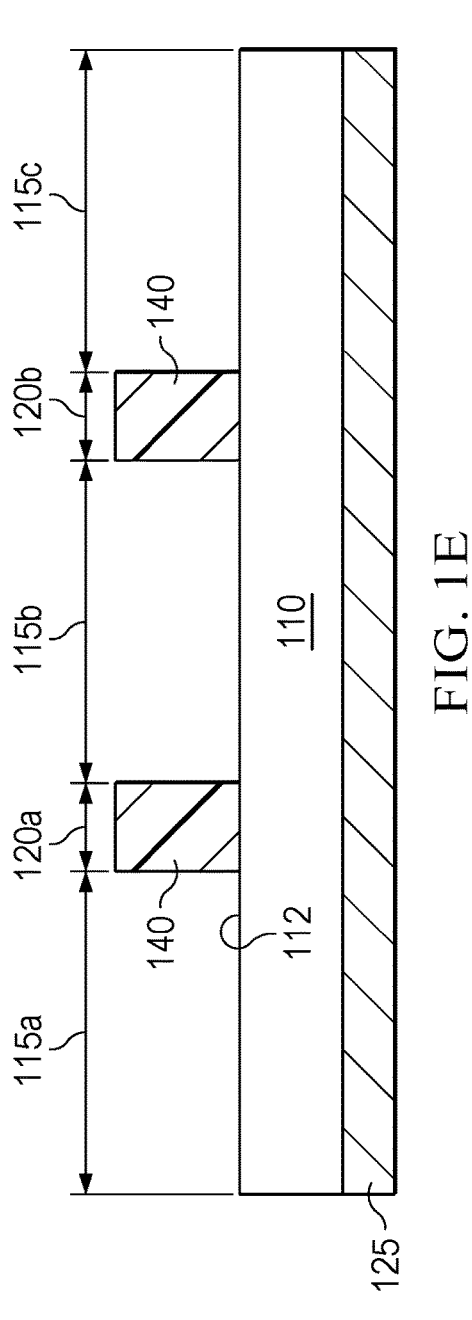
Figure 1F:
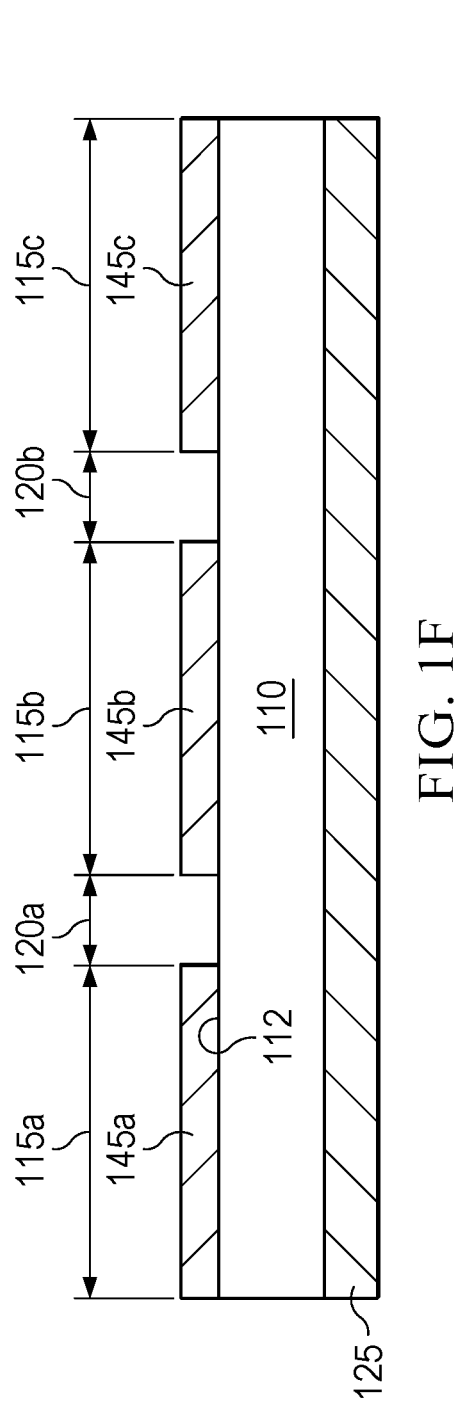

FIGS. 1C through 1F illustrate methods of forming BSM structures that each covers the back side of the semiconductor die 115. The scribe lines 120 between the semiconductor dies 115 are uncovered by the BSM structures as shown in FIG. 1F. In other words, the scribe lines 120 are exposed to subsequent process steps—e.g., the plasma etch step described with reference to FIG. 1H.

Figure 2:
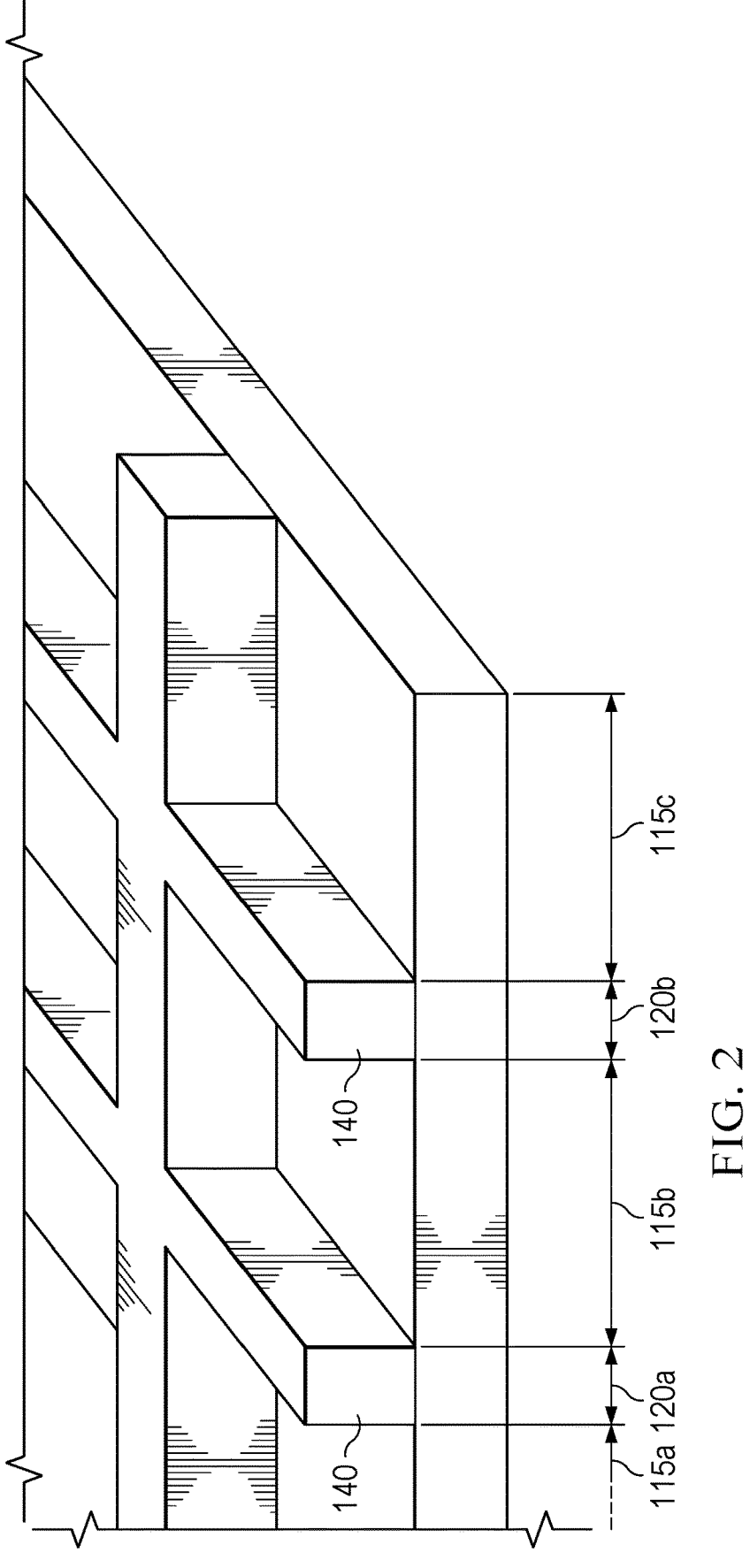
FIG. 2 is a three-dimensional schematic diagram of a sacrificial structure formed on a semiconductor substrate in accordance with embodiments of the present disclosure.

FIG. 1C shows a second adhesive tape 135 (attached to a frame ring 136) is attached to the first adhesive tape 130. Subsequently, a sacrificial structure 140 can be formed on the back side 112 of the semiconductor substrate 110 as shown in FIG. 1D. The sacrificial structure 140 may be configured to cover the scribe lines 120. FIG. 2 illustrates a three-dimensional (3D) schematic diagram of the sacrificial structure 140 that covers the scribe area. In some embodiments, the sacrificial structure 140 can be formed based on a photolithography process. In such embodiments, the sacrificial structure 140 may include a photoresist. FIG. 1E shows that the first and second adhesive tapes 130 and 135 have been removed (detached) in preparation for subsequent process steps.

FIG. 1F shows that the BSM structures 145 (also identified individually as BSM structures 145a-c) are formed at the back side 112 of the semiconductor substrate 110 based on the sacrificial structure 140. For example, a metal layer may be deposited on the back side 112 of the semiconductor substrate 110 with the sacrificial structure 140. In other words, a metal layer can be formed on the sacrificial structure 140 and the back side 112 of the semiconductor substrate 110 uncovered by the sacrificial structure 140. Subsequently, the sacrificial structure 140 can be removed such that a portion of the metal layer formed on the sacrificial structure 140 are removed. In this manner, the BSM structures 145 can be formed on the back side 112 of individual semiconductor dies 115. In some embodiments, the BSM structures 145 may be approximately one (1) to three (3) microns thick. The scribe lines 120 are exposed (i.e., uncovered by the BSM structures 145) as a result of removing the sacrificial structure 140. The term "approximately," as used herein, may refer to ±5% to ±10% variations of the recited values in some cases. In other cases, the term "approximately" may refer to ±10% to ±20% variations of the recited values.

Although foregoing example process steps utilizes a sacrificial structure (e.g., a photoresist structure) to partition the metal layer deposited on the back side 112 of the semiconductor substrate 110, the present disclosure is not limited thereto. For example, a blanket metal layer may be deposited on the back side 112 of the semiconductor substrate 110 without forming a sacrificial structure. Subsequently, a photolithography process can be done on the blanket metal layer to cover the blanket metal layer corresponding to individual semiconductor dies 115. An etch process (e.g., dry etch process) can be applied to the blanket metal layer to remove a portion of the metal layer to expose the scribe lines.

Thereafter, the photoresist covering the metal layer corresponding to individual semiconductor dies 115 can be removed to generate the BSM structures 145 at the back side 112 of the semiconductor substrate 110 as shown in FIG. 1F.

Figure 1G:
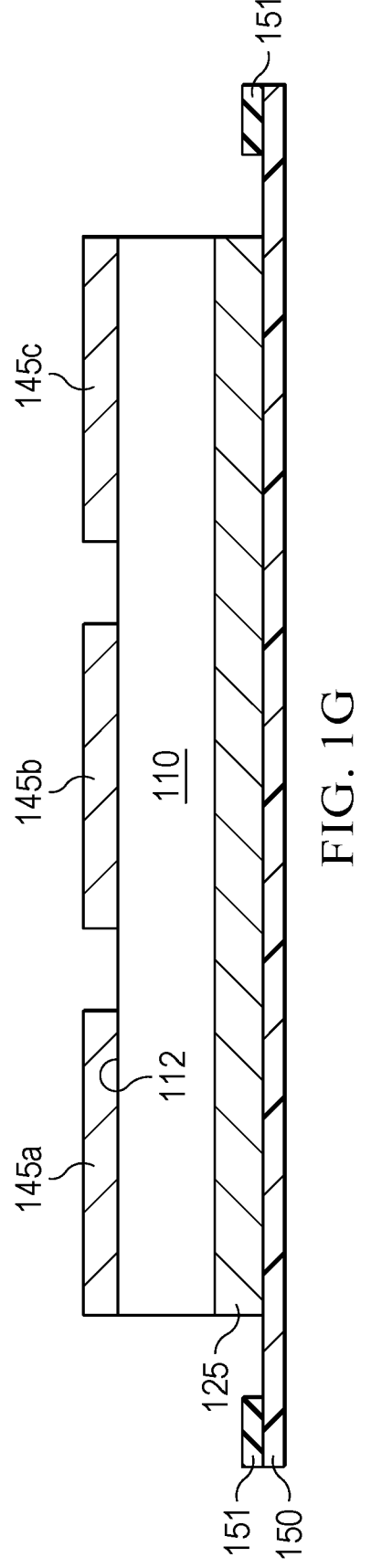
Figure 1H:
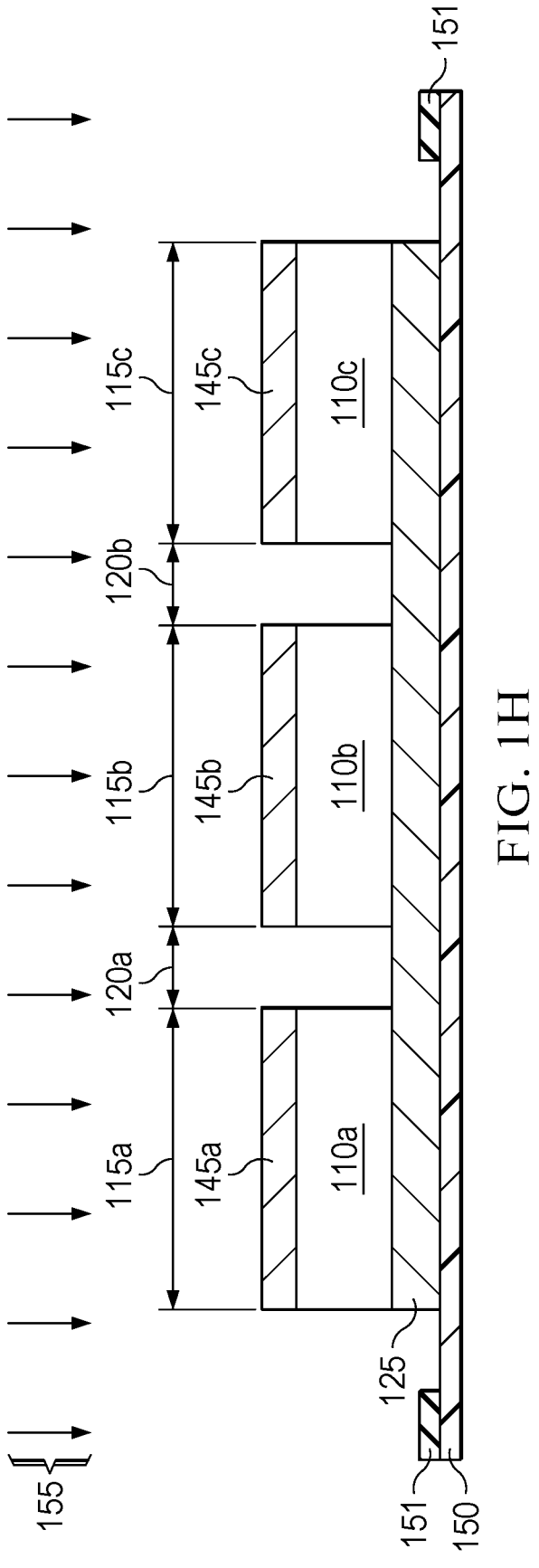

FIG. 1G shows that the semiconductor substrate 110 with the BSM structures 145 on its back side 112 is mounted on a third adhesive tape 150 (attached to a frame ring 151). FIG. 1H shows that a portion of the semiconductor substrate 110 is removed using a plasma etch process. The plasma etch process may have an etch selectivity configured to preserve the BSM structure 145. Moreover, the plasma etch process may have an etch selectivity configured to preserve the dielectric layer 125. As a result of applying the plasma etch process to the semiconductor substrate 110 from the back side 112, individual semiconductor dies 115 are separated (singulated, diced) from the semiconductor substrate 110. In other words, part of the semiconductor substrate 110 corresponding to the scribe lines 120 is removed by the flux 155 of the plasma etch process. The semiconductor dies 115, however, are connected to each other through the dielectric layer 125.

In this regard, the plasma etch process uses the BSM structures 145 as masks based on the etch selectivity against the BSM structures 145, which protect the semiconductor substrate 110 corresponding to the semiconductor dies 115 during the plasma etch process. Accordingly, one or more edges of the BSM structures 145 may be aligned to corresponding edges of the semiconductor substrate 110 of the semiconductor dies 115 as shown in FIG. 1H. In other words, one or more edges of the semiconductor substrate 110 of the semiconductor dies 115 can be self-aligned to the corresponding edges of the BSM structures 145. Moreover, the semiconductor substrate 110 of the semiconductor dies 115 may have a cross-sectional area (i.e., a cross-sectional area substantially parallel to the back side 112 of the semiconductor substrate 110, a footprint) that is substantially the same as a cross-sectional area of the BSM structures 145—e.g., no more than 5% difference, no more than 10% difference, no more than 15% difference, or the like.

In view of the etch selectivity configured to preserve the dielectric layer 125, the plasma etch process may be regarded to have stopped when the dielectric layer 125 is exposed from the back side 112 as a result of removing the semiconductor substrate 110 of the scribe line area. The etch selectivity against the dielectric layer 125 may facilitate managing variations in the final thickness of the semiconductor substrate 110—e.g., variations in the final thickness T2 after the back-grind step as shown in FIG. 1B. For example, the plasma etch process may be considered to have stopped locally in a first region of the semiconductor substrate 110 while the plasma etch process may be still actively progressing in a second region of the semiconductor substrate 110, where the first region has a final thickness that is less than the second region. In some embodiments, the plasma etch process can be applied for a predetermined amount of time—e.g., a fixed-time etch process. In other embodiments, the time to apply the plasma etch process can be dynamically determined based on determining a certain percentage of the dielectric layer 125 being exposed—e.g., an end-pointed etch process.

The plasma etch process may include deposition steps and etch steps that alternate with each other. The etch steps may be configured primarily to remove the semiconductor material of the semiconductor substrate 110, for example by forming by-products of the plasma etch process including the semiconductor material. Moreover, the deposition steps may be configured primarily to deposit certain by-products (which may be referred to as polymers) of the plasma etch process on sidewalls of the semiconductor substrate 110. In this manner, the sidewalls of the semiconductor substrate 110 remaining under the BSM structures 145 may be maintained substantially perpendicular to the back side 112 of the semiconductor substrate 110. In some embodiments, the plasma etch process includes fluorine (F)—e.g., fluorine-based plasma etch process generating the flux 155 including F atoms.

As a result of alternating the etch steps and deposition steps, the sidewall profiles of the semiconductor substrate 110 may be uneven (not shown in FIG. 1H) as described in more detail with reference to FIG. 3B. In some embodiments, the uneven side wall profiles include a plurality of raised lines substantially parallel to the back side 112 of the semiconductor substrate 110. In some embodiments, the uneven sidewall profiles include ribbed surfaces, undulating surfaces, surfaces with ridges, surfaces with crests and troughs, or a combination thereof.

Figure 1I:
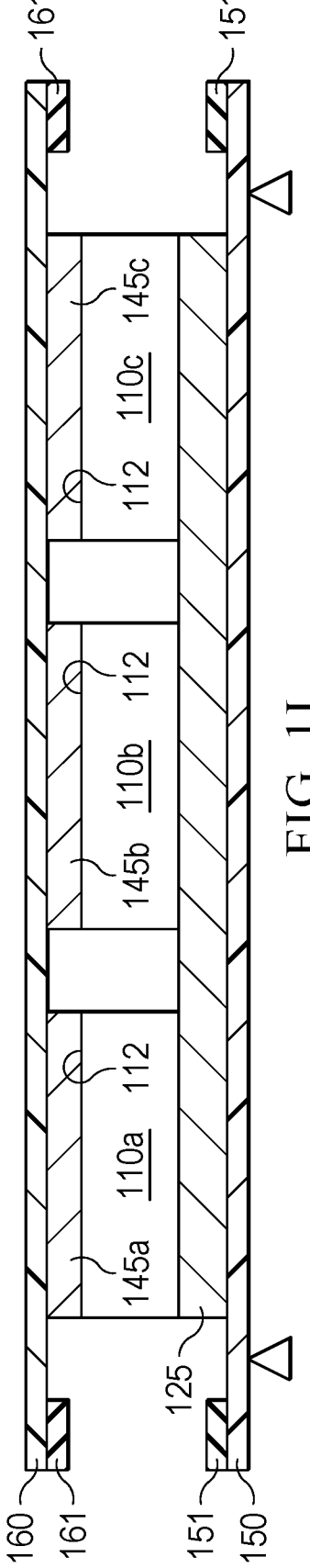
Figure 1J:
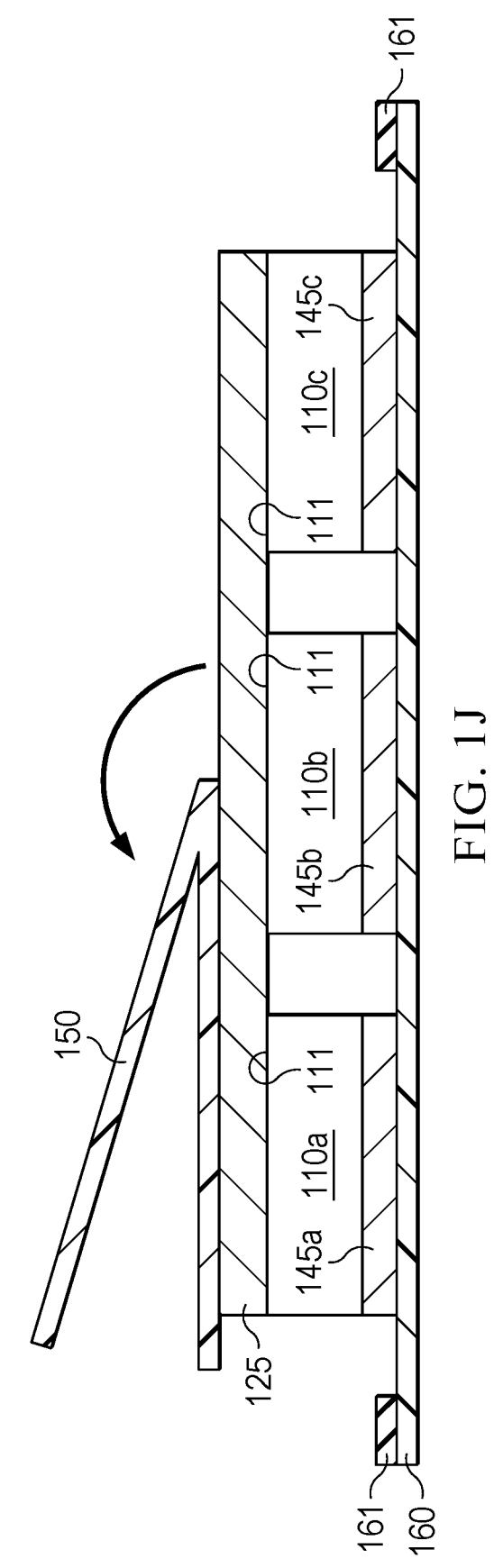

FIG. 1I shows that a fourth adhesive tape 160 (attached to a frame ring 161) is attached to the BSM structures 145 after completing the plasma etch process step described above with reference to FIG. 1H. FIG. 1I also depicts cutting of the third adhesive tape 150 (as indicated with two triangles) to remove the frame ring 151. FIG. 1J shows that the remaining portion of the third adhesive tape 150 is removed (e.g., peeled) from the dielectric layer 125. After removing the third adhesive tape 150, the dielectric layer 125 that has been exposed from the back side 112 is the only structure that connects individual semiconductor dies 110 to each other.

Figure 1K:
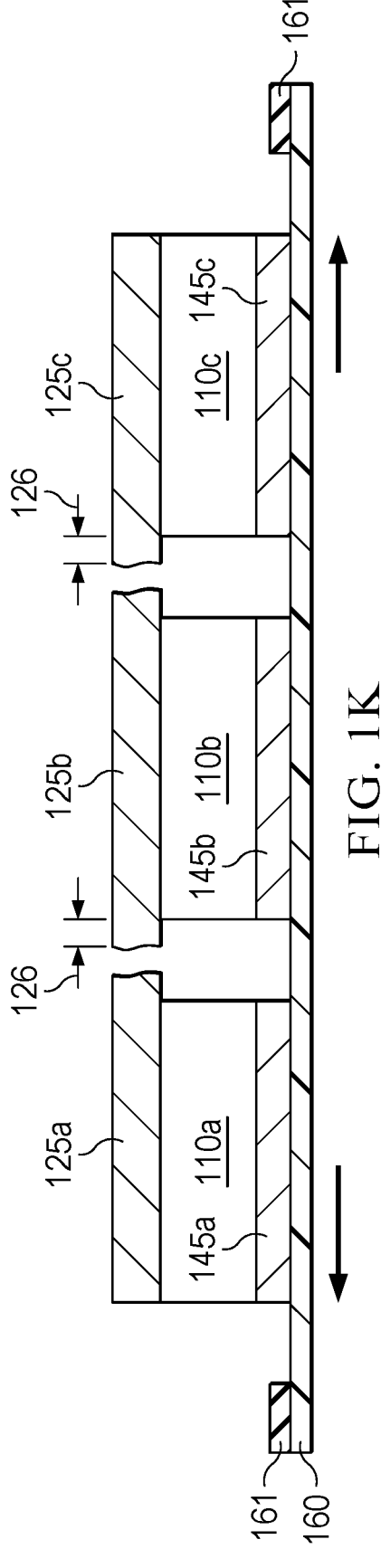

FIG. 1K shows that the exposed portion of the dielectric layer 125 can be severed (broken) by pulling the fourth adhesive tape 160 as indicated by two lateral arrows directed to opposite directions. Physically separating (breaking) the exposed portion of the dielectric layer 125 may be independent of whether the dielectric layer 125 corresponding to the scribe lines 120 includes any scribe line structures or whether the scribe line structures (if any) include a metal layer or not. Accordingly, the present disclosure can provide for separating individual semiconductor dies 115 regardless of any metal layers or structures present in the scribe lines 120.

As a result of severing (breaking) the exposed portion of the dielectric layer 125, the dielectric layer 125 may include one or more portions 126 extended beyond edges of the semiconductor substrate 110 of individual semiconductor dies 115. The portions 126 may be regarded as free-standing beyond the edge of the semiconductor substrate 110, or hanging over a space unsupported by the semiconductor substrate 110. In some cases, the portions 126 may be referred to as burrs of the dielectric layer 125.

In some embodiments, the semiconductor dies 115 including the burrs 126 as depicted in FIG. 1K may be considered ready for the rest of assembly process steps—e.g., being picked up from the adhesive tape 160 to be mounted on a lead frame, forming wire bonds, forming a mold structure to protect the semiconductor dies 115, and so on. For example, if the width of the scribe lines 120 is approximately 10 microns or less, the burrs 126 may remain with the semiconductor dies 115—e.g., the ultrasonic water jet process described with reference to FIG. 1L may be omitted. Moreover, the scribe lines that are approximately 10 microns wide (or less) may not include any scribe line structures (with or without a metal layer).

Figure 1L:
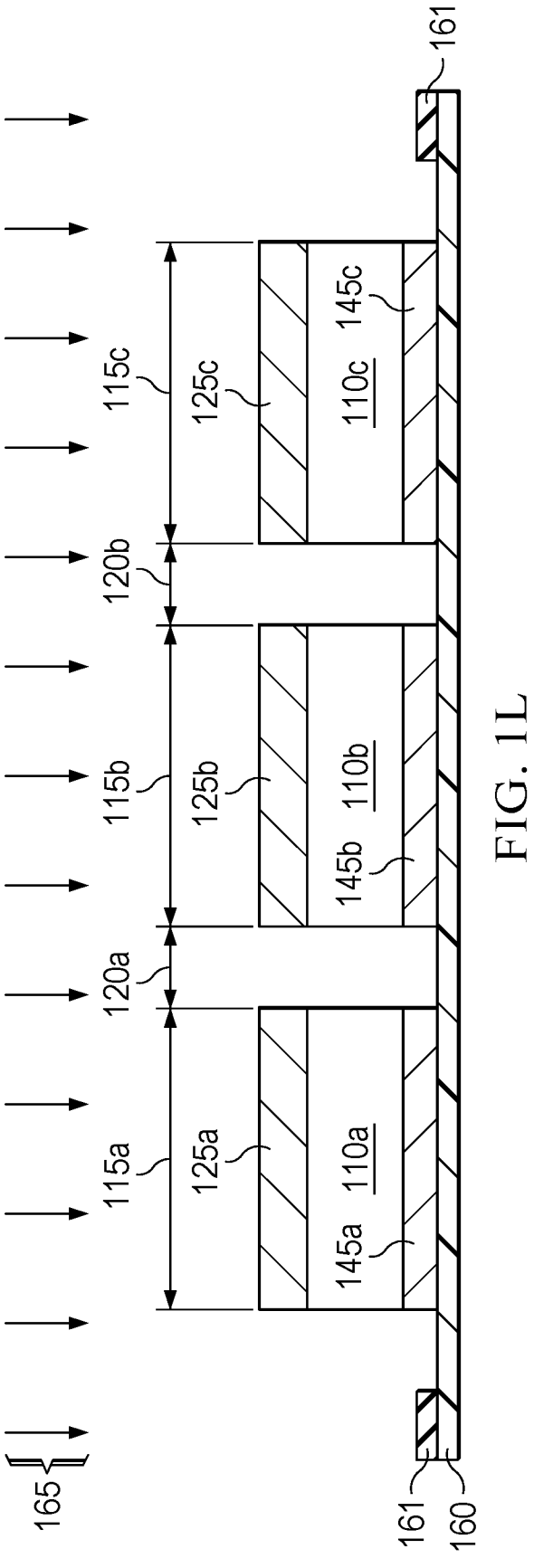
Figure 4:
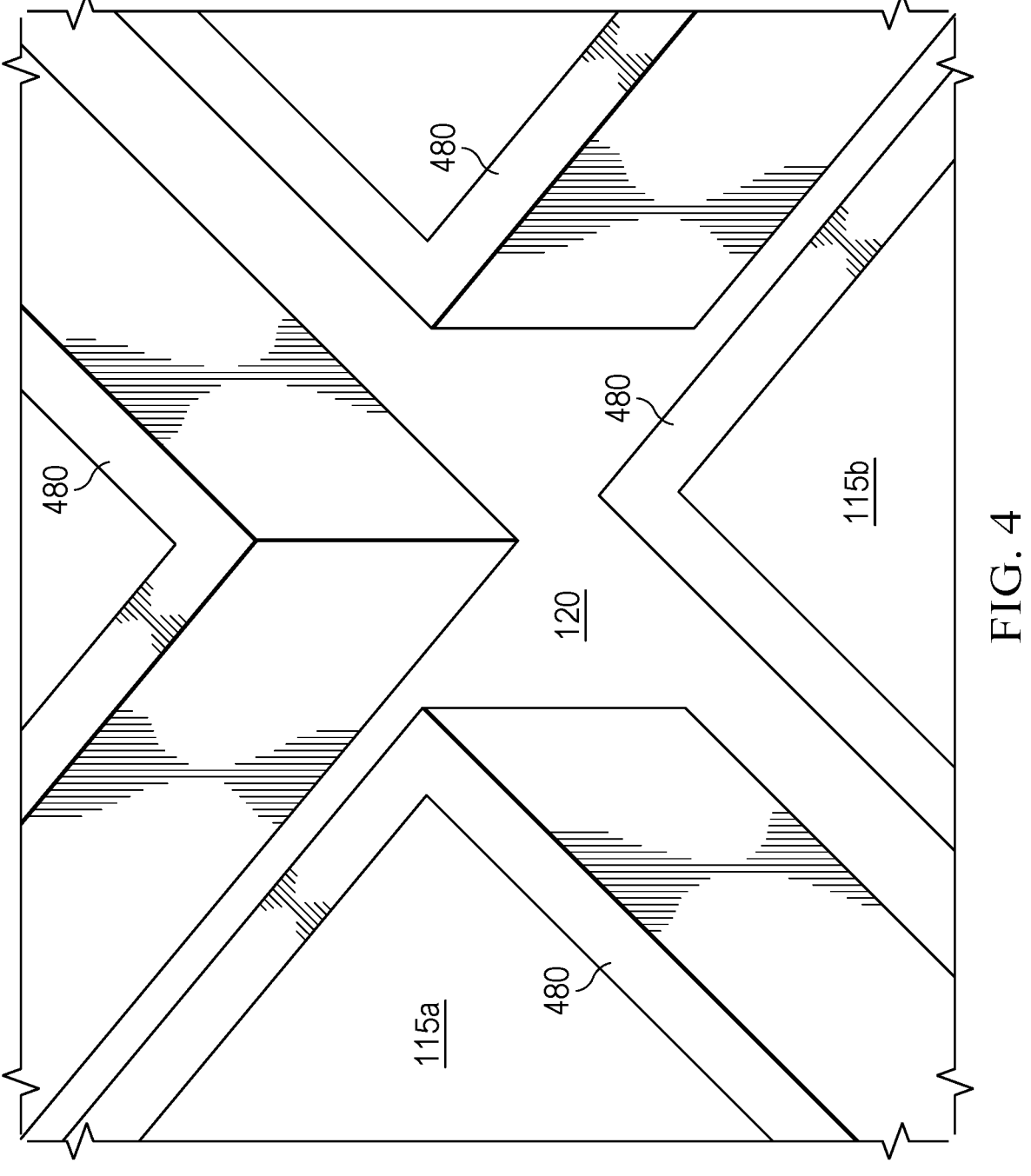
FIG. 4 is a three-dimensional schematic diagram of semiconductor dies in accordance with embodiments of the present disclosure.

FIG. 1L shows that the burrs 126 of the dielectric layer 125 (or remnants of expansion debris) can be removed. Also, FIG. 4 shows a 3D schematic diagram of the semiconductor dies 115 after the burrs 126 are removed. For example, an ultrasonic water jet process 165 can be utilized to remove the burrs 126 of the dielectric layer 125. In some embodiments, the ultrasonic water jet process 165 includes applying ultrasonic oscillation and pressure to a stream of water. In some embodiments, the ultrasonic oscillation may range approximately between 500 to 3,000 hertz (Hz). In some embodiments, the pressure may range approximately between 10 to 40 pounds per square inch (psi). The semiconductor dies 115 depicted in FIG. 1L are ready for the rest of assembly process steps—e.g., being picked up from the adhesive tape 160 to be mounted on a lead frame, forming wire bonds, forming a mold structure to protect the semiconductor dies 115, and so on.

As described herein, separating the semiconductor dies 115 from the semiconductor substrate 110 in accordance with embodiments of the present disclosure eliminates mechanical sawing (dicing) of the semiconductor substrate 110. Accordingly, the final thickness of the semiconductor substrate 110 can be reduced to be less (thinner) than typical thicknesses required by mechanical dicing techniques (e.g., 4 mils or so to endure the mechanical stress). For example, the final thickness of the semiconductor substrate 110 (e.g., T2 described with reference to FIG. 1B) may be 3 mils, 2 mils, 1 mil, or even less.

Moreover, the thinner final thickness of the semiconductor substrate 110 is expected to provide additional advantages. For example, the thinner final thickness tends to reduce the aspect ratio for the plasma etch process described with reference to FIG. 1H—e.g., when the width of the scribe lines 120 is fixed. The reduced aspect ratio may facilitate maintaining the sidewall profile to be substantially perpendicular to the back side of the semiconductor substrate 110. Additionally, the thinner final thickness may facilitate reducing the scribe line width, decreasing the throughput time for the plasma etch process, reducing resistance between source and drain of power FETs, or the like.

FIG. 2 is a three-dimensional (3D) schematic diagram of a sacrificial structure (e.g., the sacrificial structure 140) formed on a semiconductor substrate (e.g., the semiconductor substrate 110) in accordance with embodiments of the present disclosure. As described above with reference to FIG. 1E, the sacrificial structure 140 covers the scribe lines 120 (a scribe region, a scribe area) of the semiconductor substrate 110. In some embodiments, the sacrificial structure 140 includes a photoresist. As described above with reference to FIG. 1F, the BSM structures can be formed on the back side 112 of the semiconductor substrate 110 uncovered by the sacrificial structure 140—i.e., the areas corresponding to the semiconductor dies 115.

Figure 3A:
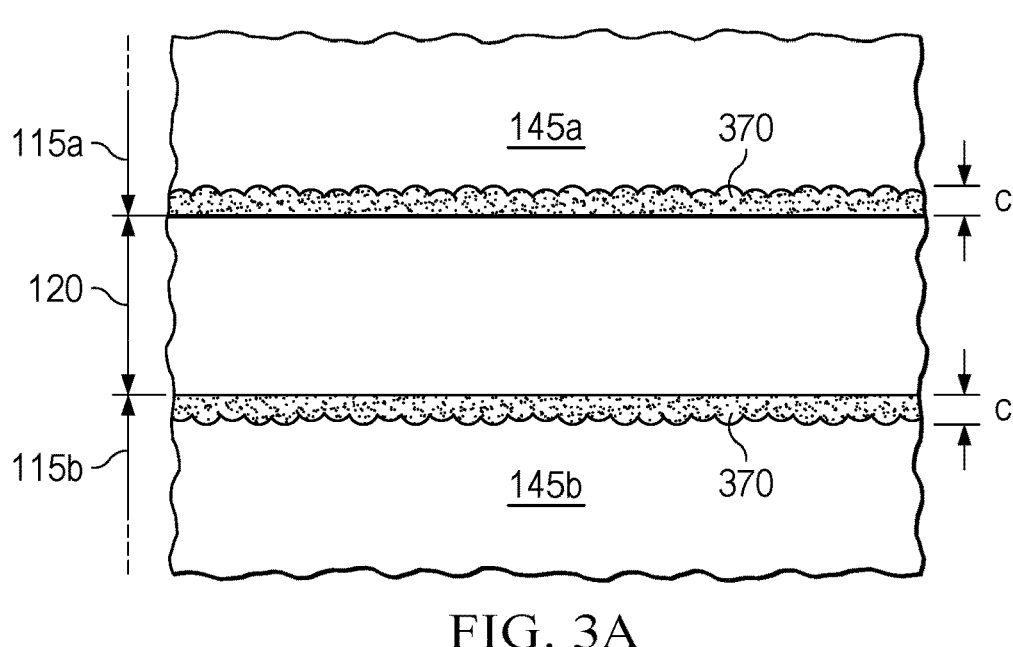
FIGS. 3A and 3B are a plan view and a cross-sectional side view of a semiconductor substrate in accordance with embodiments of the present disclosure.
Figure 3B:
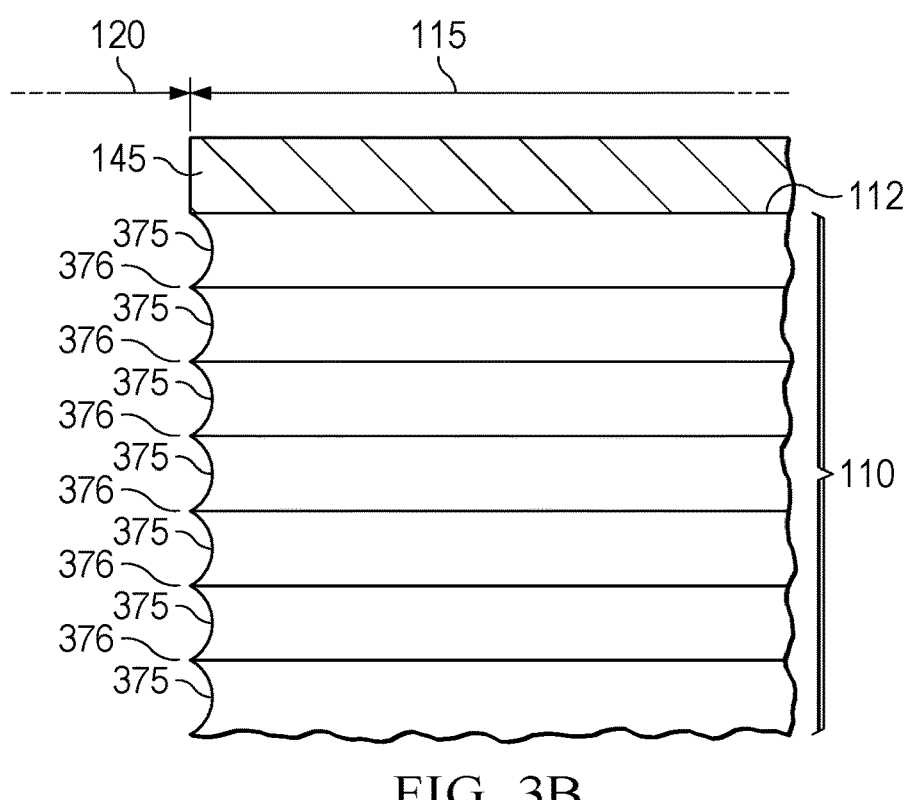

FIGS. 3A and 3B are a plan view and a cross-sectional side view of a semiconductor substrate (e.g., the semiconductor substrate 110) in accordance with embodiments of the present disclosure. FIG. 3A may be regarded as a top-down view of the back side 112 of the semiconductor dies 115 after completing the plasma etch process described with reference to FIG. 1H. FIG. 3A depicts two semiconductor dies 115a and 115b, as well as the scribed line 120 between them. A portion of the semiconductor substrate 110 corresponding to the scribe line 120 has been removed by the plasma etch process. The back side 112 of the semiconductor dies 115a/b are covered with the BSM structures 145a/b, respectively. Moreover, FIG. 3A depicts chips 370 formed on the BSM structures 145a/b as a result of the plasma etch process. The chips 370 may include undercutting of the BSM structures 145a/b. The chips 370 may irregularly extend from the edge of the BSM structures 145a/b inbound toward the center of the semiconductor dies 115 to a distance C as denoted in FIG. 3A. In some embodiments, the distance C may vary between 1 to 3 microns after completing the plasma etch process.

FIG. 3B may be regarded as a cross-sectional side view near the back side 112 of the semiconductor substrate 110 after completing the plasma etch process described with reference to FIG. 1H. FIG. 3B depicts the BSM structure 145 and a portion of the semiconductor substrate 110 covered (protected) by the BSM structure 145 during the plasma etch process. Accordingly, at least one edge of the BSM structure 145 aligns with a corresponding edge of the semiconductor substrate 110. Moreover, the plasma etch process may form uneven sidewall profiles of the semiconductor substrate 110. The uneven sidewall profiles may be regarded as a result of the plasma etch process progressing (advancing) through the semiconductor substrate 110 by alternating multiple cycles of etching steps and deposition steps. The uneven sidewall profiles includes troughs 375 (grooves) and ridges 376 (crests or raised lines with respect to the troughs 375). Accordingly, the uneven sidewall profiles may be regarded to include ribbed surfaces and/or undulating surfaces.

FIG. 4 is a 3D schematic diagram of semiconductor dies (e.g., the semiconductor dies 115) in accordance with embodiments of the present disclosure. FIG. 4 may be regarded as a 3D perspective view showing the front side 111 of the semiconductor dies 115 after completing the ultrasonic water jet process described with reference to FIG. 1L. Corners of four semiconductor dies 115 and the scribe lines 120 between them are depicted in FIG. 4. A portion of the semiconductor substrate 110 corresponding to the scribe lines 120 has been removed by the plasma etch process described with reference to FIG. 1H. Moreover, the burrs 126 of the dielectric layer 125 have been removed by the ultrasonic water jet process described with reference to FIG. 1L. Accordingly, one or more edges of the dielectric layer 125 are aligned to the corresponding edges of the semiconductor substrate 110 of the semiconductor dies 115. The semiconductor dies 115 of FIG. 4 include seal ring structures 480 (which may be referred to as etch ring structures), each of which is configured to surround the semiconductor die 115. After completing the ultrasonic water jet process, the semiconductor dies 115 are attached only to the fourth tape 160 as described with reference to FIG. 1L. Accordingly, the bottom of the scribe lines 120 may be regarded as the fourth tape 160. The uneven sidewall profiles of the semiconductor dies 115 are omitted in FIG. 4.

Figure 5A:
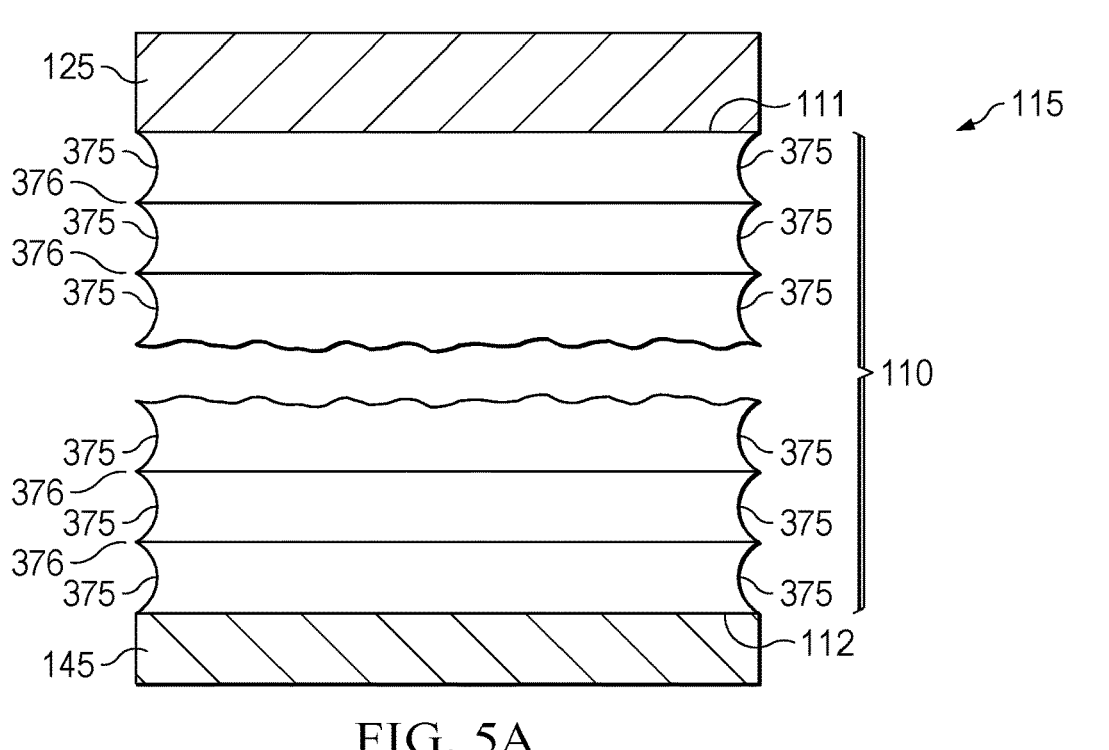
FIGS. 5A and 5B are cross-sectional schematic diagrams of semiconductor dies in accordance with embodiments of the present disclosure.
Figure 5B:
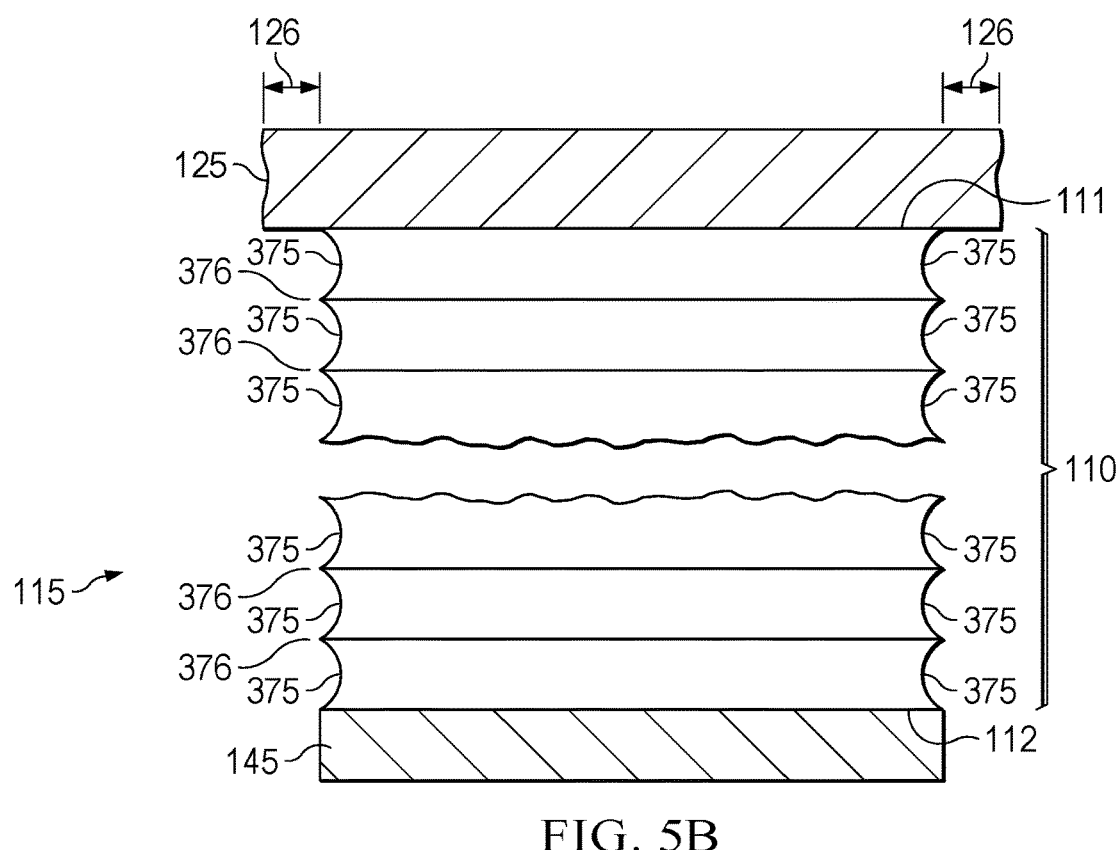

FIGS. 5A and 5B are cross-sectional schematic diagrams of semiconductor dies (e.g., the semiconductor dies 115) in accordance with embodiments of the present disclosure. FIG. 5A may be regarded as illustrating the semiconductor die 115 depicted in FIG. 1L, detached from the adhesive tape 160 after completing the ultrasonic water jet process to remove the burrs 126. The semiconductor die 115 includes a semiconductor substrate (e.g., the semiconductor substrate 110) including integrated circuitry at a front side (e.g., the front side 111) of the semiconductor substrate and a metal structure (e.g., the BSM structure 145) formed on a back side (e.g., the back side 112) of the semiconductor substrate opposite the front side. The semiconductor substrate includes a sidewall profile including a set of ridges (e.g., the ridges 376).

In some embodiments, the ridges are substantially parallel to the back side of the semiconductor substrate. In some embodiments, the ridges surround the semiconductor substrate. Moreover, the sidewall profile can be substantially perpendicular to the back side of the semiconductor substrate. In some embodiments, the sidewall profile includes a ribbed surface, an undulating surface, a surface with raised portions, a surface with crests and troughs, or a combination thereof.

In some embodiments, the metal structure includes at least one edge aligned to a corresponding edge of the semiconductor substrate. In some embodiments, the semiconductor substrate has a first cross-sectional area (footprint), and the metal structure has a second cross-sectional area (footprint) that is substantially same as the first cross-sectional area. In some embodiments, the semiconductor die also includes a dielectric layer (e.g., the dielectric layer 125) at the front side of the semiconductor substrate. The dielectric layer includes one or more inter-level metallization (MLM) layers. The MLM layers may be coupled to the integrated circuitry of the semiconductor die. In some embodiments, at least one edge of the dielectric layer is aligned to a corresponding edge of the semiconductor substrate. In some embodiments, the integrated circuitry includes a power FET.

FIG. 5B may be regarded as illustrating the semiconductor die 115 depicted in FIG. 1K, detached from the adhesive tape 160 without the ultrasonic water jet process. Accordingly, the semiconductor die 115 depicted in FIG. 5B includes at least one edge of the dielectric layer that is extended beyond a corresponding edge of the semiconductor substrate.

FIG. 6 is a flowchart 600 illustrating methods of separating semiconductor dies in accordance with aspects of the present disclosure. The flowchart 600 includes aspects of methods described with reference to FIG. 1A through FIG. 4. The method includes partitioning a metal layer formed on a back side of a semiconductor substrate including a plurality of dies on a front side opposite the back side, wherein a scribe region of the semiconductor substrate is exposed as a result of partitioning the metal layer (box 610). The method further includes applying a plasma etch process configured to remove the scribe region exposed, wherein a portion of a dielectric layer disposed at the front side of the semiconductor substrate is exposed as a result of applying the plasma etch process (box 615). The method further includes severing the portion of the dielectric layer exposed (box 620).

In some embodiments, the plasma etch process has an etch selectivity configured to preserve the metal layer. In some embodiments, the plasma etch process has an etch selectivity configured to preserve the dielectric layer. In some embodiments, the plasma etch process includes deposition steps and etch steps that alternate with each other. In some embodiments, the dielectric layer includes one or more inter-level metallization layers. In some embodiments, partitioning the metal layer forms a plurality of metal structures corresponding to the plurality of dies. In some embodiments, the plasma etch process utilizes the metal structures as masks that protect the semiconductor substrate.

In some embodiments, each one of the metal structures includes at least one edge aligned to an edge of corresponding one of the dies. In some embodiments, applying the plasma etch process forms uneven sidewall profiles of individual dies of the plurality. In some embodiments, the uneven sidewall profiles include a plurality of raised lines substantially parallel to the back side of the semiconductor substrate. In some embodiments, the uneven sidewall profiles are substantially perpendicular to the back side of the semiconductor substrate. In some embodiments, the uneven sidewall profiles include ribbed surfaces, undulating surfaces, surfaces with ridges, surfaces with crests and troughs, or a combination thereof.

In some embodiments, the method further includes applying an ultrasonic water jet process configured to remove burrs of the dielectric layer based on severing the exposed portion of the dielectric layer. In some embodiments, the ultrasonic water jet process includes applying ultrasonic oscillation and pressure to a stream of water, the ultrasonic oscillation ranging approximately between 500 to 3,000 hertz (Hz) and the pressure ranging approximately between 10 to 40 pounds per square inch (psi). In some embodiments, the method further includes attaching a tape to a first surface of the dielectric layer opposite a second surface exposed to the plasma etch process, wherein severing the exposed portion of the dielectric layer includes expanding the tape attached to the first surface of the dielectric layer. In some embodiments, the method further includes thinning the semiconductor substrate from the back side prior to forming the metal layer on the back side of the semiconductor substrate.

In some embodiments, partitioning the metal layer includes removing a sacrificial structure located between the metal layer and the scribe region of the semiconductor substrate. In some embodiments, the sacrificial structure includes a photoresist. In some embodiments, partitioning the metal layer includes forming a plurality of mask structures on the metal layer corresponding to the plurality of dies, and removing a portion of the metal layer uncovered by the plurality of mask structures such that the scribe region of the semiconductor substrate is exposed.

FIG. 7 is a flowchart 700 illustrating methods of separating semiconductor dies in accordance with aspects of the present disclosure. The flowchart 700 includes aspects of methods described with reference to FIG. 1A through FIG. 4. The method includes forming a sacrificial structure on a back side of a semiconductor substrate including a plurality of dies at a front side opposite the back side, wherein the sacrificial structure covers a scribe area of the semiconductor substrate (box 710). The method further includes forming a metal layer on the sacrificial structure and the back side of the semiconductor substrate uncovered by the sacrificial structure (box 715). The method further includes removing the sacrificial structure and a portion of the metal layer formed on the sacrificial structure, wherein the scribe area is exposed as a result of removing the sacrificial structure (box 720). The method further includes removing the scribe area of the semiconductor substrate, wherein a portion of a dielectric layer located at the front side of the semiconductor substrate is exposed from the back side as a result of removing the scribe area of the semiconductor substrate (box 725). The method further includes breaking the portion of the dielectric layer exposed (box 730).

In some embodiments, the sacrificial structure includes a photoresist. In some embodiments, removing the portion of the metal layer forms a plurality of metal structures corresponding to the plurality of dies. In some embodiments, each one of the metal structures includes at least one edge aligned to an edge of corresponding one of the dies. In some embodiments, removing the scribe area of the semiconductor substrate includes applying a plasma process having deposition steps and etch steps that alternate with each other. In some embodiments, removing the scribe area of the semiconductor substrate forms uneven sidewall profiles of individual dies of the plurality. In some embodiments, the uneven sidewall profiles include a plurality of raised lines substantially parallel to the back side of the semiconductor substrate.

In some embodiments, the uneven sidewall profiles are substantially perpendicular to the back side of the semiconductor substrate. In some embodiments, the portion of the dielectric layer exposed includes one or more inter-level metallization layers. In some embodiments, the method further includes removing burrs of the portion of the dielectric layer that has been broken. In some embodiments, removing the burrs includes utilizing an ultrasonic water jet process that applies ultrasonic oscillation and pressure to a stream of water, the ultrasonic oscillation ranging approximately between 500 to 3,000 hertz (Hz) and the pressure ranging approximately between 10 to 40 pounds per square inch (psi).

In some embodiments, the method further includes thinning the semiconductor substrate from the back side prior to forming the sacrificial structure on the back side of the semiconductor substrate. In some embodiments, the method further includes attaching a tape to the dielectric layer after removing the scribe area of the semiconductor substrate, wherein breaking the exposed portion of the dielectric layer includes expanding the tape attached to the dielectric layer.

While various embodiments of the present disclosure have been described above, it is to be understood that they have been presented by way of example and not limitation. Numerous changes to the disclosed embodiments can be made in accordance with the disclosure herein without departing from the spirit or scope of the present disclosure. In addition, while in the illustrated embodiments various features or components have been shown as having particular arrangements or configurations, other arrangements and configurations are possible. Moreover, aspects of the present technology described in the context of example embodiments may be combined or eliminated in other embodiments. Thus, the breadth and scope of the present disclosure is not limited by any of the above described embodiments.

What is claimed is:

1. A method, comprising:
   forming a patterned metal layer on a back side of a semiconductor substrate including a plurality of dies on a front side opposite the back side, wherein a scribe region of the semiconductor substrate is uncovered by the patterned metal layer;
   applying a plasma etch process configured to remove the scribe region uncovered by the patterned metal layer, wherein a portion of a dielectric layer disposed at the front side of the semiconductor substrate is exposed as a result of applying the plasma etch process;
   attaching an adhesive tape to the patterned metal layer;
   severing the portion of the dielectric layer by pulling the adhesive tape in opposite directions; and
   applying an ultrasonic water jet process configured to remove burrs of the dielectric layer based on severing the portion of the dielectric layer.

2. The method of claim 1, wherein the plasma etch process has an etch selectivity configured to preserve the patterned metal layer.

3. The method of claim 1, wherein the plasma etch process has an etch selectivity configured to preserve the dielectric layer.

4. The method of claim 1, wherein the plasma etch process includes deposition steps and etch steps that alternate with each other.

5. The method of claim 1, wherein the dielectric layer includes one or more inter-level metallization layers.

6. The method of claim 1, wherein the patterned metal layer includes a plurality of metal structures corresponding to the plurality of dies.

7. The method of claim 6, wherein the plasma etch process utilizes the plurality of metal structures as masks that protect the semiconductor substrate.

8. The method of claim 6, wherein each one of the metal structures includes at least one edge aligned to an edge of corresponding one of the dies.

9. The method of claim 1, wherein applying the plasma etch process forms uneven sidewall profiles of individual dies of the plurality.

10. The method of claim 9, wherein the uneven sidewall profiles include a plurality of raised lines substantially parallel to the back side of the semiconductor substrate.

11. The method of claim 9, wherein the uneven sidewall profiles are substantially perpendicular to the back side of the semiconductor substrate.

12. The method of claim 9, wherein the uneven sidewall profiles include ribbed surfaces, undulating surfaces, surfaces with ridges, surfaces with crests and troughs, or a combination thereof.

13. The method of claim 1, wherein the ultrasonic water jet process includes applying ultrasonic oscillation and pressure to a stream of water, the ultrasonic oscillation ranging approximately between 500 to 3,000 hertz (Hz) and the pressure ranging approximately between 10 to 40 pounds per square inch (psi).

14. The method of claim 1, further comprising:
thinning the semiconductor substrate from the back side prior to forming the patterned metal layer on the back side of the semiconductor substrate.

15. A method, comprising:
forming a patterned conductive layer on a back side of a semiconductor substrate including a plurality of dies at a front side opposite the back side, wherein a scribe area of the semiconductor substrate is uncovered by the patterned conductive layer;
removing the scribe area of the semiconductor substrate, wherein a portion of a dielectric layer located at the front side of the semiconductor substrate is exposed from the back side as a result of removing the scribe area of the semiconductor substrate;
attaching a tape to the patterned conductive layer;
breaking the portion of the dielectric layer by expanding the tape attached to the patterned conductive layer; and
removing burrs of the portion of the dielectric layer that has been broken.

16. The method of claim 15, wherein the patterned conductive layer includes a plurality of metal structures corresponding to the plurality of dies.

17. The method of claim 16, wherein each one of the metal structures includes at least one edge aligned to an edge of corresponding one of the dies.

18. The method of claim 15, wherein removing the scribe area of the semiconductor substrate includes applying a plasma process having deposition steps and etch steps that alternate with each other.

19. The method of claim 15, wherein removing the scribe area of the semiconductor substrate forms uneven sidewall profiles of individual dies of the plurality.

20. The method of claim 19, wherein the uneven sidewall profiles include a plurality of raised lines substantially parallel to the back side of the semiconductor substrate.

21. The method of claim 19, wherein the uneven sidewall profiles are substantially perpendicular to the back side of the semiconductor substrate.

22. The method of claim 15, wherein the portion of the dielectric layer exposed includes one or more inter-level metallization layers.

23. The method of claim 15, wherein removing the burrs includes utilizing an ultrasonic water jet process that applies ultrasonic oscillation and pressure to a stream of water, the ultrasonic oscillation ranging approximately between 500 to 3,000 hertz (Hz) and the pressure ranging approximately between 10 to 40 pounds per square inch (psi).

24. The method of claim 15, further comprising:
thinning the semiconductor substrate from the back side prior to forming the patterned conductive layer on the back side of the semiconductor substrate.

* * * * *